May 19, 1959 L. J. HRUSKA 2,887,573

CONVERTER WITH HIGH FREQUENCY CRYSTAL TRANSISTOR OSCILLATOR

Filed Nov. 5, 1956

INVENTOR.
LEO J. HRUSKA
BY
Walter G. Finch
ATTORNEY

United States Patent Office 2,887,573

Patented May 19, 1959

2,887,573

CONVERTER WITH HIGH FREQUENCY CRYSTAL TRANSISTOR OSCILLATOR

Leo J. Hruska, Lutherville, Md.

Application November 5, 1956, Serial No. 620,527

2 Claims. (Cl. 250—20)

The present invention relates to transistor oscillators. More particularly, it relates to crystal controlled transistor oscillators providing stabilized frequency outputs.

It is recognized that the frequency of oscillation of prior transistor oscillators is subject to variation, generally in more than tolerable degree, as a result of voltage or temperature variation.

It is therefore an object of the present invention to provide a stable transistor oscillator operating at higher radio frequencies than have heretofore been attained.

Another object of the present invention is the provision of a crystal controlled transistor oscillator in which the signal oscillations occur at a harmonic of the fundamental crystal frequency.

An additional object of the present invention is to provide a crystal controlled high radio frequency transistor oscillator having a self-biasing circuit in which the usual bias cell is eliminated.

A further object of the present invention is to provide a stabilized frequency convertor.

Still another object of the present invention is to provide a crystal controlled transistor oscillator which functions, by virtue of suitable signal injection means, as a frequency convertor.

The attainment of these and other objects of the present invention will be apparent as an understanding of its construction and operation is gained through study of the following detailed description and the accompanying drawings in which.

Transistor oscillators are known in the art and for the purpose of better illustrating the novel features of the present invention, the construction of several known transistor oscillator circuits will be briefly considered.

Figure 1:
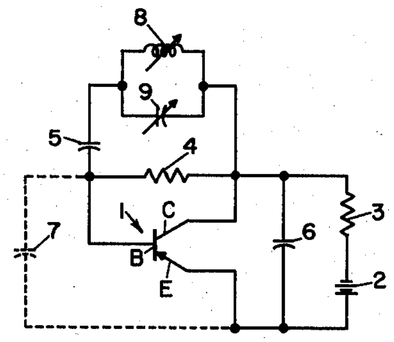
Fig. 1 is a schematic diagram of a prior transistor oscillator of the grounded emitter type.

In Fig. 1 a transistor oscillator of the grounded emitter type is illustrated. The active element of the circuit is a transistor 1 which may be either the NPN or PNP junction type. Current for circuit operation is derived from a battery 2 and supplied to the collector of transistor 1 through a resistor 3. For shunt feed applications, resistor 3 may be replaced by a suitable inductor. A bias resistor 4 is connected between the base and collector electrodes of transistor 1 to provide suitable operating conditions.

The return side of the battery 2 is connected to the emitter electrode of transistor 1. A tank circuit comprising an inductor 8 shunted by a capacitor 9 is connected through a blocking capacitor 5 between the base and collector electrodes of transistor 1. Feedback for oscillating action is obtained through capacitor 6, connected between the collector and emitter electrodes of transistor 1, and through the inherent capacitance 7 existing between the base and emitter electrode.

The equivalent circuit of a piezoelectric crystal is approximately represented by a parallel resonant circuit of high Q. By the simple expedient of replacing the tank circuit comprising inductor 8 and capacitor 9 of Fig. 1, a crystal controlled transistor oscillator results.

Figure 2:
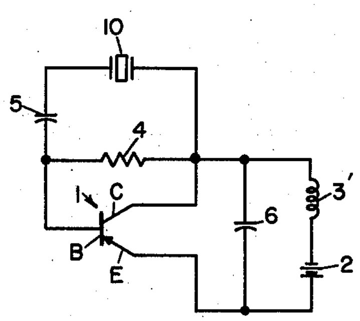
Fig. 2 is a schematic diagram of a known type of crystal controlled transistor oscillator.

Fig. 2 illustrates a crystal controlled transistor oscillator related to the circuit of Fig. 1 in the manner just described. In an article appearing in the May 1953 issue of "Electronics," a McGraw-Hill publication, Sultzer describes the application of such an oscillator as a frequency standard. With a suitable feedback capacitor 6, oscillation occurs whether the shunt feed impedance 3 is resistive or inductive in nature. When applied as a frequency standard, a usual practice is to choose the reactance of blocking capacitor 5 sufficiently high to prevent the oscillator from operating in a saturated condition, thereby preventing the production of undesired harmonics.

Figure 3:
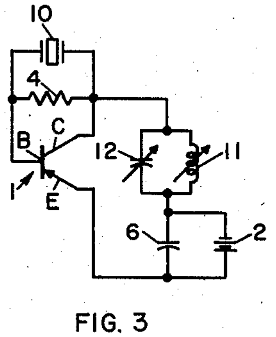
Fig. 3 is a schematic diagram of the crystal controlled oscillator of the present invention.

The crystal controlled transistor oscillator of the present invention is illustrated in Fig. 3. The circuit variations from the known oscillator of Fig. 2 include the direct connection of the crystal 10 from the base to the collector electrodes of transistor 1, and the replacement of current feed impedance 3' with a tank circuit comprising an inductor 11 and a capacitor 12 connected in parallel.

By such an innovation higher frequency stabilized operation is attained than might be hoped for in conventional circuits. First, the elimination of the conventional blocking capacitor provides a hard crystal driving force which causes the crystal 10 to vibrate in complex modes including many harmonics of the crystal fundamental frequency. The tank circuit comprising inductor 11 and capacitor 12 selects an odd harmonic of the crystal 10, as the 3rd, 5th, or 7th and, assuming the tank circuit to have a reasonably high Q, considerably reinforces the harmonic signal. It is well to note that although reference is made to crystal harmonic frequencies, as a practical matter, the harmonic frequencies of a crystal are not exactly integral multiples of the fundamental. Nevertheless, it is common in the art to refer to higher modes of crystal vibration as harmonics and such terminology is retained herein.

The advance represented by the present invention confers several beneficial advantages. As is well known, limitations in the mechanical strength of a crystal impose an upper limit on the fundamental frequency to which the crystal can be ground. By means of the present invention rugged crystals can be utilized to provide the desired frequency output which may lie even at the upper limits of prior oscillators. Further, if ruggedness is not of primary concern, considerably higher frequency operation is enabled than with prior types.

Figure 4:
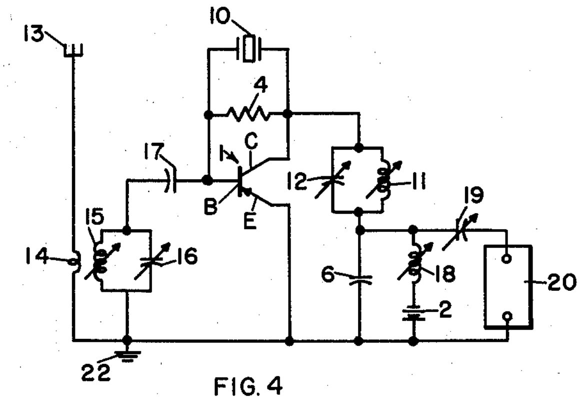
Fig. 4 is a schematic diagram of the present invention in which the novel crystal controlled oscillator is combined with signal injection means to provide a frequency convertor.

In Fig. 4, the oscillator of the present invention is illustrated in combination with signal injection means which enable the oscillator to function as a stabilized frequency convertor.

An independent signal, developed, for example, in a receiving antenna 13 is transferred to a tuned circuit comprising inductor 15 and capacitor 16 by means of antenna coil 14. The voltage selected by the tuned antenna circuit is coupled into the base electrode of transistor 1 by a capacitor 17. The rectifying action of the transistor 1 in passing signals between its base and collector electrodes supplies the non-linearity essential for the generation of the sum and difference frequencies between the independent signal and the oscillator signals. The sum or difference frequency signal, as desired, is passed to a utilization circuit, such as an amplifier 20, by a broadbanded coupling circuit comprising an inductor 18 inserted series with the battery 2 and a capacitor 19 connected from the junction of inductor 18 and capacitor 6 to the input terminal of amplifier 20. The circuit thus provides a stable and compact frequency converter requiring but a single semiconductive element for the generation of local oscillations and the amplification of the mixed signal is thereby provided.

Figure 5:
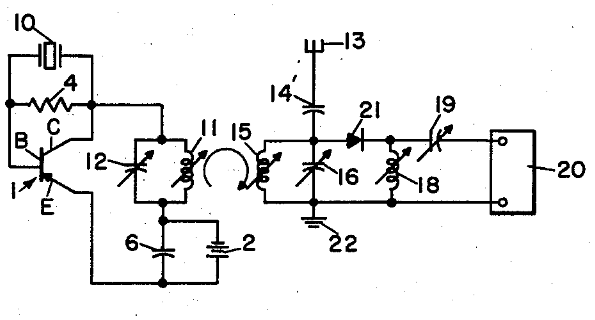
Fig. 5 is a schematic diagram illustrating the means of coupling the oscillator of the present invention into a conventional mixer circuit.

In Fig. 5, the application of the oscillator of the present invention in a conventional mixing circuit is illustrated. The oscillator output signal is inductively coupled to the tank circuit of inductor 15 and capacitor 16, while signal received by antenna 13 is injected by a capacitor 14'. A crystal diode 21 mixes the superposed antenna signal and oscillator output signal to provide sum and difference frequencies. The sum or difference frequency signal, as desired, is coupled to amplifier 20 with the broadbanded coupling arrangement of inductor 18 and capacitor 19. Although the circuit of Fig. 5 requires an element in the form of a crystal diode in addition to the elements of Fig. 4, it is nevertheless possessing many of the same advantages as the circuit of Fig. 4, and in the event that the independent signal lies fairly close in frequency to the oscillator frequency, the circuit of Fig. 5 is preferred. Both circuits, moreover, are capable of operating at high frequencies, and both circuits are rugged, reliable and stabile in operation.

Obviously there exists many equivalents of the elements specifically described herein. It should therefore be understood that the scope of the appended claims alone limit the practice of the invention.

What is claimed is:

1. An electrical frequency converter, comprising, a crystal controlled transistor oscillator including a transistor having a semiconductive body of the junction type and an emitter, a base, and a collector electrode cooperatively associated therewith, means for biasing said base electrode with respect to said collector electrode, a piezoelectric crystal connected externally to said transistor directly between said base and collector electrodes thereof and arranged to oscillate at one of the odd modes exclusive of the fundamental mode thereof, a feedback path connected from said collector electrode to said emitter electrode, said feedback path including a first parallel resonant circuit including a capacitor and an inductor having a resonant frequency corresponding to an odd harmonic of the fundamental vibration frequency of said piezoelectric crystal, said biasing means including a battery connected between said emitter electrode and a point intermediate of said feedback path and a resistor connected in parallel with said piezoelectric crystal, a diode, a second parallel resonant circuit coupled to said inductor of said first parallel resonant circuit and connected to said diode, and means for injecting an independent signal into said diode thereby providing a complex output signal including one frequency component equal to the sum of said independent signal frequency and an odd harmonic of the fundamental frequency of said piezoelectric crystal and another frequency component equal to the difference between the frequency of said independent signal and the odd harmonic of the fundamental frequency of said piezoelectric crystal.

2. An electrical frequency converter, comprising a crystal controlled transistor oscillator including a transistor having a semiconductive body of the junction type and an emitter, a base, and a collector electrode cooperatively associated therewith, means for biasing said base electrode with respect to said collector electrode, a piezoelectric crystal connected externally to said transistor directly between said base and collector electrodes thereof and arranged to oscillate at one of the odd modes exclusive of the fundamental mode thereof, a feedback path connected from said collector electrode to said emitter electrode, said feedback path including a first parallel resonant circuit including a capacitor and an inductor having a resonant frequency corresponding to an odd harmonic of the fundamental vibration frequency of said piezoelectric crystal, said biasing means including a battery connected between said emitter electrode and a point intermediate of said feedback path and a resistor connected in parallel with said piezoelectric crystal, a diode, a second parallel resonant circuit coupled to said inductor of said first parallel resonant circuit and connected to said diode, means for injecting an independent signal into said diode thereby providing a complex output signal including one frequency component equal to the sum of said independent signal frequency and an odd harmonic of the fundamental frequency of said piezoelectric crystal and another frequency component equal to the difference between the frequency of said independent signal and the odd harmonic of the fundamental frequency of said piezoelectric crystal, and a utilization circuit including a broadband coupler and an amplifier connected to the output of said diode, whereby said independent signal to said diode is changed in frequency for utilization by said utilization circuit to produce a useful output.

References Cited in the file of this patent

UNITED STATES PATENTS

| | | |
|---|---|---|
| 2,485,045 | Gerber | Oct. 18, 1949 |
| 2,570,840 | O'Brien | Oct. 9, 1951 |
| 2,692,337 | Hansen | Oct. 19, 1954 |
| 2,742,571 | Herzog | Apr. 17, 1956 |
| 2,745,963 | Hahnel | May 15, 1956 |
| 2,770,731 | Bopp | Nov. 13, 1956 |
| 2,774,866 | Burger | Dec. 18, 1956 |

OTHER REFERENCES

"A Developmental Pocket Size . . . ," by Holmes et al., Proceedings of I.R.E., June 1955, pages 662 to 670, only 663 is cited.

"Transistor Broadcast Receivers," by Stern et al., Electrical Engineering, December 1954, pages 1107–1112, only page 1109 is cited.